US006938310B2

(12) United States Patent
Hawkins et al.

(10) Patent No.: US 6,938,310 B2
(45) Date of Patent: Sep. 6, 2005

(54) METHOD OF MAKING A MULTI-LAYER MICRO-ELECTROMECHANICAL ELECTROSTATIC ACTUATOR FOR PRODUCING DROP-ON-DEMAND LIQUID EMISSION DEVICES

(75) Inventors: Gilbert A. Hawkins, Mendon, NY (US); Michael J. DeBar, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 465 days.

(21) Appl. No.: 10/229,359

(22) Filed: Aug. 26, 2002

(65) Prior Publication Data

US 2004/0036740 A1 Feb. 26, 2004

(51) Int. Cl.[7] .......................... H04R 17/00; B41J 2/04; G11B 5/27; H01L 2/00

(52) U.S. Cl. ..................... 29/25.35; 29/594; 29/890.1; 347/54; 216/27; 438/21

(58) Field of Search .............................. 29/25.35, 594, 29/846, 890.1, 847, 831; 216/27, 99, 33; 438/21; 347/54, 44, 29, 55, 67

(56) References Cited

U.S. PATENT DOCUMENTS

| | | | | | |
|---|---|---|---|---|---|
| 5,122,477 | A | * | 6/1992 | Wolters et al. | 438/3 |
| 5,565,113 | A | * | 10/1996 | Hadimioglu et al. | 216/2 |
| 5,644,341 | A | | 7/1997 | Fujii et al. | |
| 5,668,579 | A | | 9/1997 | Fujii et al. | |
| 5,685,491 | A | * | 11/1997 | Marks et al. | 239/533.12 |
| 5,739,831 | A | | 4/1998 | Nakamura et al. | |
| 5,959,338 | A | | 9/1999 | Youngner et al. | |
| 6,126,140 | A | | 10/2000 | Johnson et al. | |
| 6,127,198 | A | | 10/2000 | Coleman et al. | |
| 6,146,915 | A | * | 11/2000 | Pidwerbecki et al. | 438/21 |
| 6,235,212 | B1 | | 5/2001 | Silverbrook | |
| 6,242,321 | B1 | * | 6/2001 | Acosta et al. | 438/424 |
| 6,318,841 | B1 | | 11/2001 | Coleman et al. | |
| 6,345,884 | B1 | | 2/2002 | Yoon et al. | |
| 6,357,865 | B1 | | 3/2002 | Kubby et al. | |
| 6,358,021 | B1 | | 3/2002 | Cabuz | |
| 2001/0023523 | A1 | | 9/2001 | Kubby et al. | |

FOREIGN PATENT DOCUMENTS

| | | |
|---|---|---|
| EP | 1 226 945 A1 | 1/2002 |
| JP | 03141533 | 6/1991 |
| JP | 20011287357 | 10/2001 |

* cited by examiner

*Primary Examiner*—A. Dexter Tugbang
*Assistant Examiner*—Tai Van Nguyen
(74) *Attorney, Agent, or Firm*—Milton S. Sales

(57) ABSTRACT

An inkjet print head comprises a mandrel having flat front and rear surfaces disposed between an initially curved rear membrane and an initially flat front membrane. The rear membrane is initially hemispherically curved, in close contact at its periphery with the rear surface of the mandrel but substantially removed from the mandrel in its central region. Because the membranes are mechanically coupled, the initially curved rear membrane causes the initially flat front membrane to bow away from the front surface of the mandrel. Ink contacts only one membrane, preferably the front membrane, which is typically held at a ground potential. By applying a voltage sequence to the membranes and mandrel, the position of the actuator may be controlled in a "push-pull" manner.

11 Claims, 20 Drawing Sheets

METHOD OF MAKING A MULTI-LAYER MICRO-ELECTROMECHANICAL ELECTROSTATIC ACTUATOR FOR PRODUCING DROP-ON-DEMAND LIQUID EMISSION DEVICES

CROSS-REFERENCE TO RELATED APPLICATION

Reference is made to my commonly assigned, co-pending U.S. patent application Ser. No. 10/153,990 entitled DROP-ON-DEMAND LIQUID EMISSION USING SYMMETRICAL ELECTROSTATIC DEVICE filed concurrently herewith.

FIELD OF THE INVENTION

The present invention relates generally to micro-electromechanical (MEM) drop-on-demand liquid emission devices such as, for example, ink jet printers, and more particularly such devices which employ an electrostatic actuator for driving liquid from the device.

BACKGROUND OF THE INVENTION

Drop-on-demand liquid emission devices with electrostatic actuators are known for ink printing systems. U.S. Pat. Nos. 5,644,341 and 5,668,579, which issued to Fujii et al. on Jul. 1, 1997 and Sept. 16, 1997, respectively, disclose such devices having electrostatic actuators composed of a diaphragm and opposed electrode. The diaphragm is distorted by application of a first voltage to the electrode. Relaxation of the diaphragm expels an ink droplet from the device. Other devices that operate on the principle of electrostatic attraction and their fabrication methods are disclosed in U.S. Pat. Nos. 5,739,831; 6,127,198; 6,357,865; 6,318,841; and U.S. Publication No. 2001/0023523. Devices of these types typically require a high voltage to operate, because the gap between the diaphragm and its opposed electrode must be sufficiently large to allow for the diaphragm to move far enough to alter the liquid chamber volume by a significant amount. Large gaps, while advantageous in their tolerance to manufacturing tolerances, require large operating voltages to effect drop ejection, and this adds a manufacturing cost associated with high voltage circuitry.

The gap can be designed to be small, in order to reduce the required voltage, but this requires that the area of the device be large, so that the total volume of liquid displaced during drop ejection is kept constant. Furthermore, devices with small gaps also require very precise manufacturing methods. Such devices have been disclosed, for example, in a paper entitled "A Low Power, Small, Electrostatically-Driven Commercial Inkjet Head" by S. Darmisuki et al. of Seiko Epson Corporation; IEEE Conference Proceeding "MEMS 1998," Jan. 25–29, Heidelberg, Germany. That paper describes a method of fabrication of an electrostatic drop liquid emission device having a small gap-in which three substrates, two glass and one silicon, are anodically bonded to form an ink ejector. Drops from an ink cavity are expelled through an orifice in the rear side glass plate when a membrane formed in the silicon substrate is pulled down across the gap to contact a conductor on the front side glass plate, and is then released. Because the gap is small, the device occupies a large area; and because of the complex manufacturing method, each nozzle is expensive to manufacture.

Another related method of fabrication provides devices that use ink as a dielectric material. This reduces the operating voltage without the need for making the gaps small because the effective electrical gap is lowered by the high dielectric constant of the ink. For example, U.S. Pat. No. 6,345,884 teaches a device having an electrostatically deformable membrane with an ink refill hole in the membrane and with an electric field applied across the ink to deflect the membrane. The operating voltage is lower for this device. However, for this device, as well as others relying on ink enhanced dielectric constants, the electric field must be applied across the ink, and this reduces reliability. Also, the ink types are restricted in their ranges of dielectric constant and conductivity.

In addition to requiring high voltages, large areas, and/or complex manufacturing techniques, prior art electrostatic drop ejectors are sensitive to the elastic properties of the membranes from which they are made. In particular, it is important that displaced membranes return to their initial positions. Membrane properties are not always sufficient for that purpose, particularly for those membranes suitable for inexpensive manufacture. In particular, membranes may stick in an unreliable manner when in contact with other surfaces, and the elastic properties of membranes, such as tension and stiffness, are not always identical from membrane to membrane due to non-uniformities in deposition. Commonly assigned, copending U.S. patent application Ser. No. 10/152,194 provides for reduction of operating voltages without adding to device size, and additionally for reducing the dependence of membrane motion on elastic properties. These devices are made by a process that allows independent control of voltages on multiple electrodes, and hence allows the use of an electric field to return membranes to their initial positions. The method of manufacture of devices in accordance with application Ser. No. 10/152,194 provides a non-planar central electrode, also referred to as a mandrel. While effective in its intended purpose, a non-planar central electrode requires additional fabrication steps at an early stage of manufacture. Also, since the membranes are stretched upon initial actuation in accordance with application Ser. No. 10/152,194 and since the amount of stretch depends sensitively on the initial membrane tensile stress, the required actuation voltage is sensitive to the manufacturing process.

Prior art electrostatic drop ejectors, even those operating with reduced voltages and even those made to minimize manufacturing tolerances, require complex electrical interconnects at packaging. Interconnects typically require dielectric passivation on the print head's front side (nozzle side). Because the voltages needed for electrostatic devices are in all cases higher than one to two volts, front side interconnects are subject to corrosion from spilled ink. The fabrication of ink channels, typically provided from the back side for such devices, adds to manufacturing cost, and the fabricated ink channels are typically susceptible to clogging.

There is therefore a need to decreasing the operating voltage of electrostatic drop ejectors without compromising reliability or manufacturing cost, and a need to reduce packaging complexity, including the electrical interconnects.

SUMMARY OF THE INVENTION

An emission device for ejecting a liquid drop includes a liquid chamber and a nozzle orifice. Force applied to a first membrane in a first direction increases the chamber volume to draw liquid into the chamber. Force applied to a second membrane in a second direction decreases the chamber volume to emit a liquid drop through the nozzle orifice. A mandrel is between the first and second membranes such that (1) application of a voltage differential between the first membrane and the mandrel moves the first membrane in the first direction to increase the chamber volume and (2) application of a voltage differential between the second membrane and the mandrel moves the second membrane in the second direction to decrease the chamber volume. The mandrel has substantially planar opposed surfaces respectively facing each of the first and second membranes such that least one of the first and second membranes is substantially removed from the mandrel over a first portion of the at least one membrane and is substantially contacting the mandrel over a second portion of the at least one membrane, whereby movement of the first membrane in the first direction progressively increases contact between the first membrane and the mandrel, and movement of the second membrane in the second direction progressively increases contact between the second membrane and the mandrel.

According to a feature of the present invention, such a multi-layer micro-electromechanical electrostatic actuator is produced by depositing a layer of first dielectric material on a substrate. A portion of the substrate opposed to the layer of dielectric material is removed to form a first electrode. An initial layer of sacrificial material is formed on the layer of dielectric material at a position opposed to the substrate. A patterned electrode, herein referred to as a "mandrel," is provided on the initial layer of sacrificial material at a position opposed to the layer of first dielectric material. The method continues by forming a subsequent layer of sacrificial material on the mandrel such that an electrically isolated, planar mandrel is formed surrounded by sacrificial material; forming a curved lens on the subsequent layer of sacrificial material; and exposing a region of the layer of dielectric material through the subsequent and the initial layers of sacrificial material. A second layer of dielectric material is formed on the curved lens and on the subsequent layer of sacrificial material, such second layer of dielectric material extending to the exposed region of the layer of first dielectric material. Portions of the initial and subsequent layers of sacrificial material and of the curved lens are removed so as to form cavities interconnected by a structure about the mandrel. A second electrode is deposited on the second layer of dielectric material, whereby the first electrode and the second electrode are attached by the structure such that the first electrode, the structure, and the second electrode are free to move together relative to the mandrel.

BRIEF DESCRIPTION OF THE DRAWINGS

FIGS. 13*a* and 13*b* are side and top cross-sectional views, respectively, of the electrostatic print head of FIG. 7 after another step of the process, while

DETAILED DESCRIPTION OF THE INVENTION

As described in detail herein below, the present invention provides a process for fabricating drop-on-demand liquid emission devices that are based on electrostatic actuators. Drop-on-demand liquid emission devices are often used as print heads in ink jet printing systems. Many other applications are emerging which make use of devices similar to ink jet print heads, which emit liquids other than inks that need to be finely metered and deposited with high spatial precision.

Figure 1:
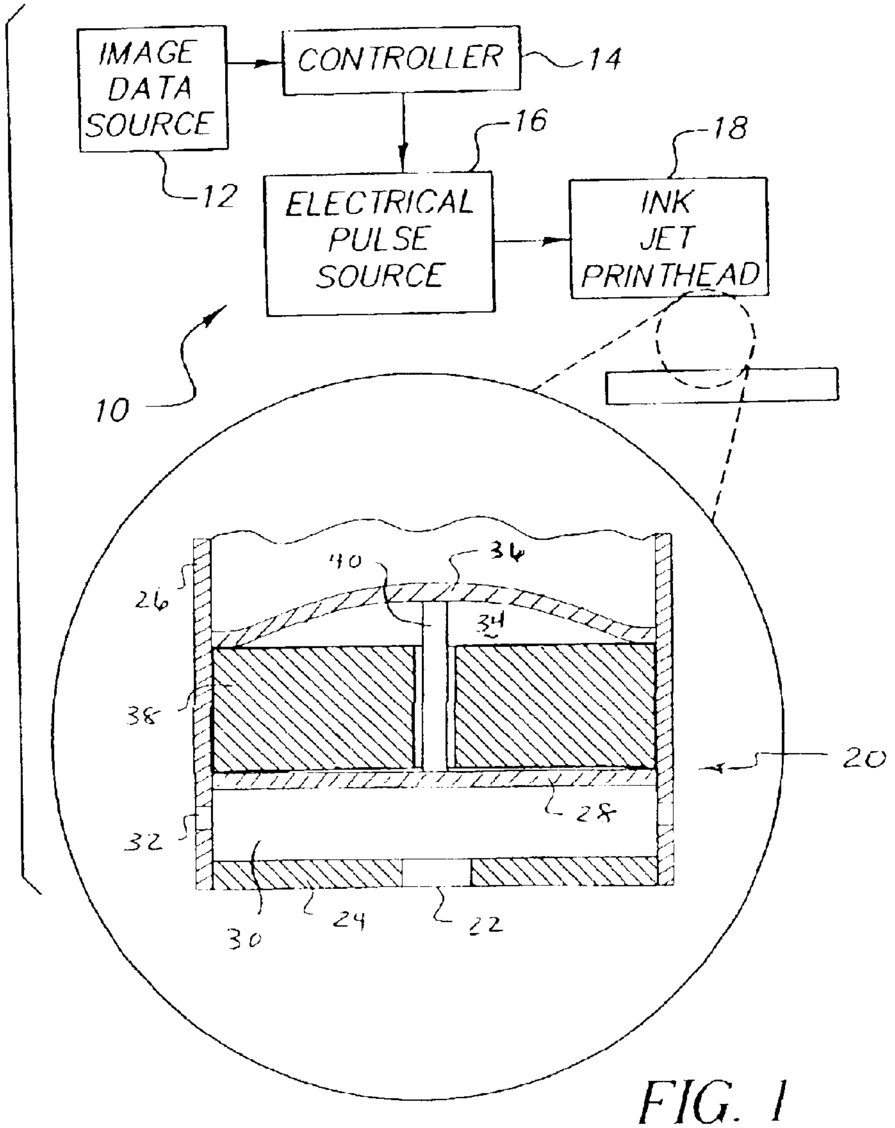
FIG. 1 is a schematic illustration of a drop-on-demand liquid emission device according to the present invention.

FIG. 1 shows a schematic representation of a drop-on-demand liquid emission device 10, such as an ink jet printer, which may be operated according to the present invention. The system includes a source 12 of data (say, image data) which provides signals that are interpreted by a controller 14 as being commands to emit drops. Controller 14 outputs signals to a source 16 of electrical energy pulses which are inputted to a drop-on-demand liquid emission device such as an ink jet printer 18.

Figure 2:
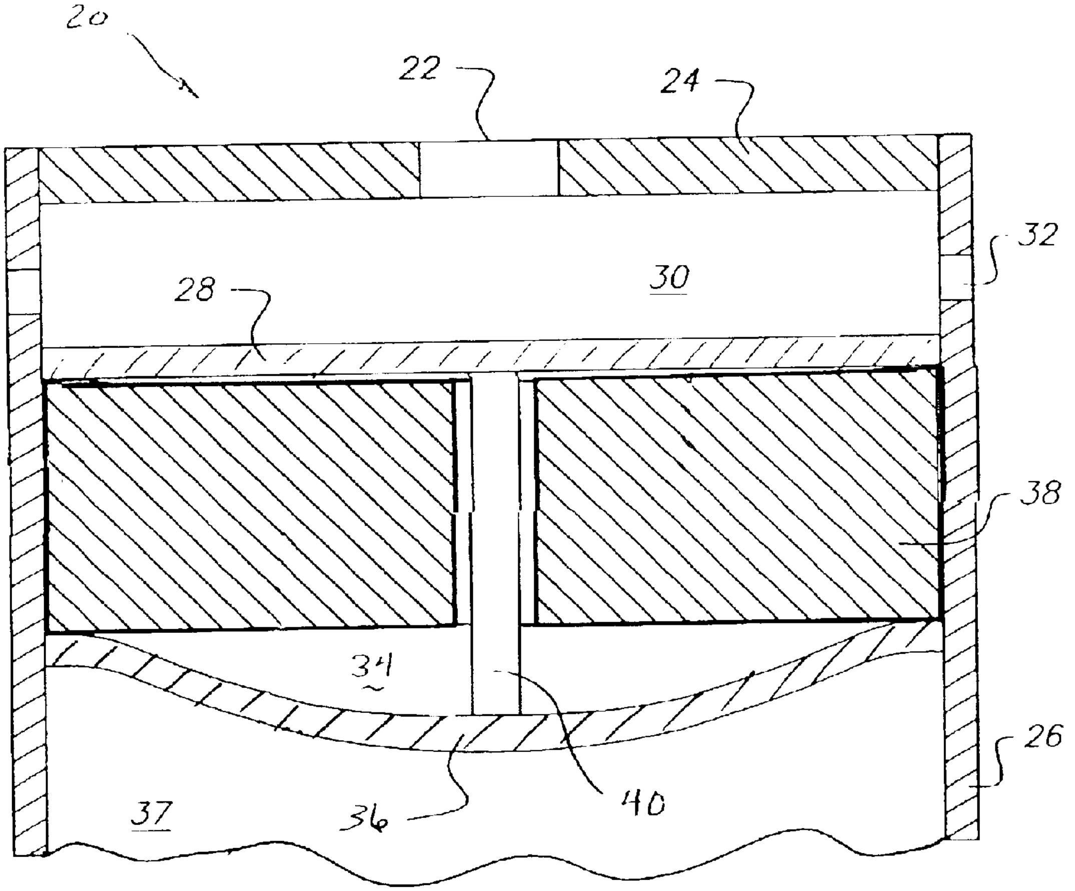
FIG. 2 is a cross-sectional view of a portion of drop-on-demand liquid emission device of FIG. 1.

Drop-on-demand liquid emission device 10 includes a plurality of electrostatic drop ejection mechanisms 20, and FIG. 2 is a cross-sectional view of one of the plurality of electrostatically actuated drop ejection mechanisms 20. A nozzle orifice 22 is formed in a nozzle plate 24 for each mechanism 20. A wall or walls 26 bound each drop ejection mechanism 20.

The outer periphery of an electrically addressable electrode membrane 28 (herein referred to as the "front side" membrane) is sealingly attached to wall 26 to define a chamber 30 adapted to receive the liquid, such as for example ink, to be ejected from nozzle orifice 22. The liquid is drawn into chamber 30 through one or more refill ports 32 from a supply, not shown, typically forming a meniscus in the nozzle orifice. Ports 32 are sized as discussed below.

Dielectric fluid fills a region 34 between front side membrane 28 and a rear side membrane 36. The dielectric fluid is preferably air or other dielectric gas, although a dielectric liquid may be used.

Rear side membrane 36, between chamber 30 and a cavity 37, is electrically addressable separately from front side membrane 28. Addressable membranes 28 and 36 are at least partially flexible and are positioned on opposite sides of a single central electrode mandrel 38 such that the two membranes and the mandrel are generally axially aligned with nozzle orifice 22.

Typically, front and rear side membranes 28 and 36 are made of somewhat flexible conductive material such as polysilicon, or, in the preferred embodiment, a combination of layers having a central conductive layer surrounded by an rear side and front side insulative layer. For example a preferred combination comprises a thin film of polysilicon stacked over a nitride layer to make the membrane structurally stiff. Mandrel 38 is preferably made from a conductive central body surrounded by a thin insulator of uniform thickness, for example silicon oxide or silicon nitride, and is rigidly attached to walls 26. The axially-spaced surfaces of mandrel 38 are flat. The mandrel associated with each nozzle is independently electrically addressable.

Rear side membrane 36 is formed with its outer periphery in substantially close proximity to, or in mechanical contact with, the rear side surface of mandrel 38, and with its central region substantially spaced from the rear side surface of the mandrel so that the volume of the space is at least equal to the volume of a drop to be emitted. Front side membrane 28 is formed in substantially close proximity to, or in mechanical contact with, the front side surface of mandrel 38, at least around its outer periphery. Around the edge of the membranes, the angle of contact between the membranes and mandrel is very small, preferably less than 5 degrees. This is achieved in the case of the front side 28 by forming the front side membrane in uniform proximity to the front side surface of the mandrel. It is therefore planar. This is achieved in the case of rear side membrane 36 by making it convex away from the mandrel.

The two addressable membranes are structurally connected via a rigid coupler 40. This coupler is electrically insulating, which term is intended to include a coupler of conductive material but having a non-conductive break therein. Coupler 40 ties the two addressable membranes structurally together and insolates the membranes so as to make possible distinct voltages on the two. The coupler may be made from conformally deposited silicon dioxide. Due to the coupling of the membranes, and because each membrane is deposited in a state of tension, the released coupled membranes move to an equilibrium position in which each membrane is in substantially close proximity to, or in mechanical contact with, the mandrel around the outer periphery and substantially spaced from the mandrel in the central region of the actuator.

The drop-on-demand liquid emission device according to the disclosed embodiment of the present invention provides for electrical connections removed from the fluid connections. The electrical connections are preferably disposed on the side of the print head opposite the nozzle.

Figure 5:
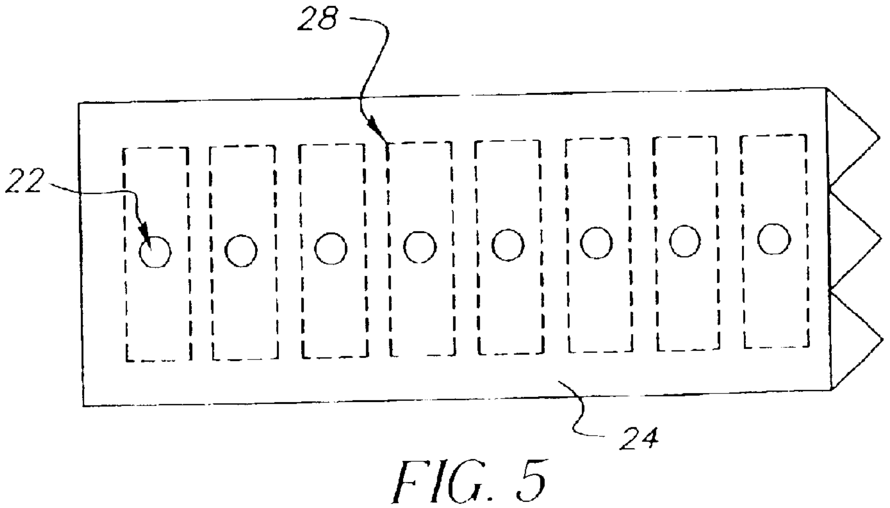
FIGS. 3–5 are top plan views of alternative embodiments of a nozzle plate of the drop-on-demand liquid emission device of FIGS. 1 and 2.
Figure 3:
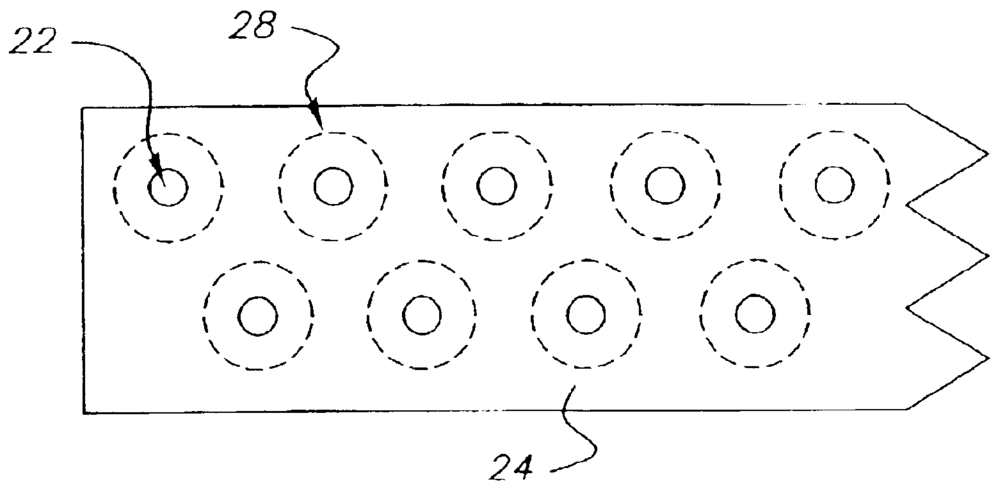
Figure 4:
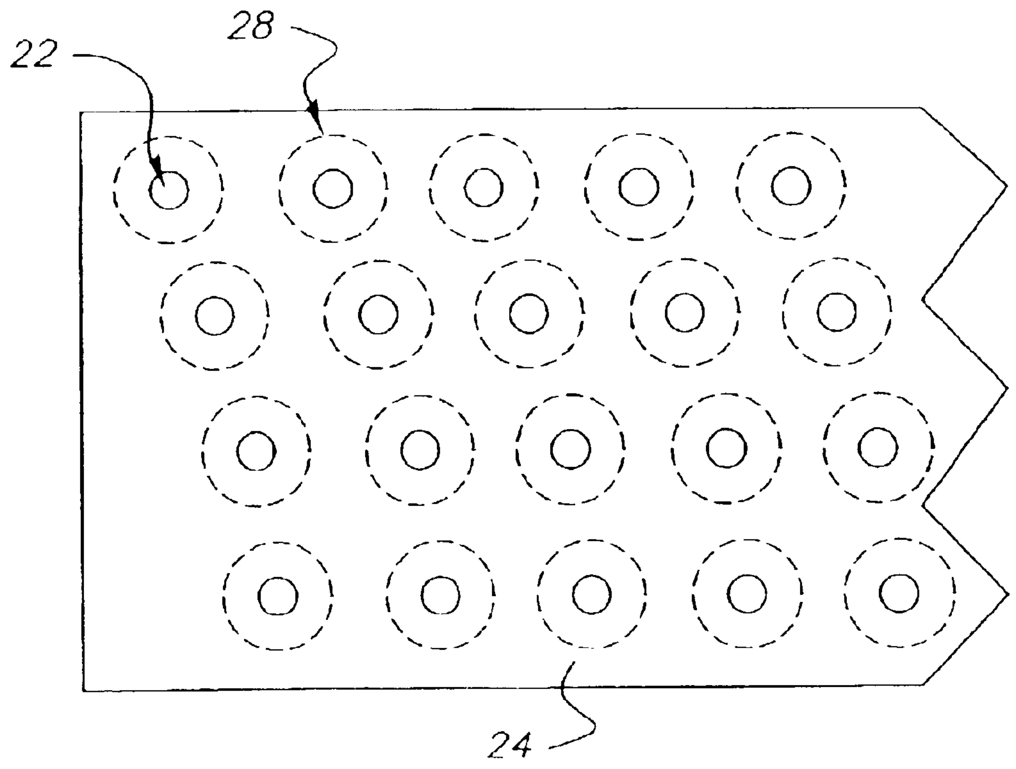

FIGS. 3–5 are top plan views of nozzle plate 24, showing several alternative embodiments of layout patterns for the several nozzle orifices 22 of a print head. Note that in FIGS. 2 and 3, the interior surface of walls 26 are annular, while in FIG. 5, walls 26 form rectangular chambers.

To eject a drop, starting from the equilibrium configuration in which each membrane is substantially spaced from the mandrel in the central region of the actuator, an electrostatic potential is applied between conductive portions of, or associated with, front side membrane 28 and mandrel 38. The potentials of central mandrel 38 and rear side membrane 36 are kept at the same. Front side membrane 28 presses down on rear side membrane 36 through rigid coupler 40, thereby deforming rear side membrane 36 downward, as shown, and storing elastic potential energy in the system. Since front side membrane 28 forms a wall portion of liquid chamber 30 behind the nozzle orifice, movement of front side membrane 28 away from nozzle plate 24 expands the chamber, drawing liquid into the expanding chamber through ports 32. Rear side membrane 36 does not receive an electrostatic charge, that is, its voltage is the same as central mandrel 38, and moves in conjunction with front side membrane 28. In accordance with a feature of the present invention, the angle of contact between the front side surface of addressable membrane 28 and the rear side surface of central mandrel 38 is less than 10 degrees and preferably less than 5 degrees. This ensures the voltage difference required to pull addressable membrane 28 down into contact with central mandrel 38 is small.

Figure 6:
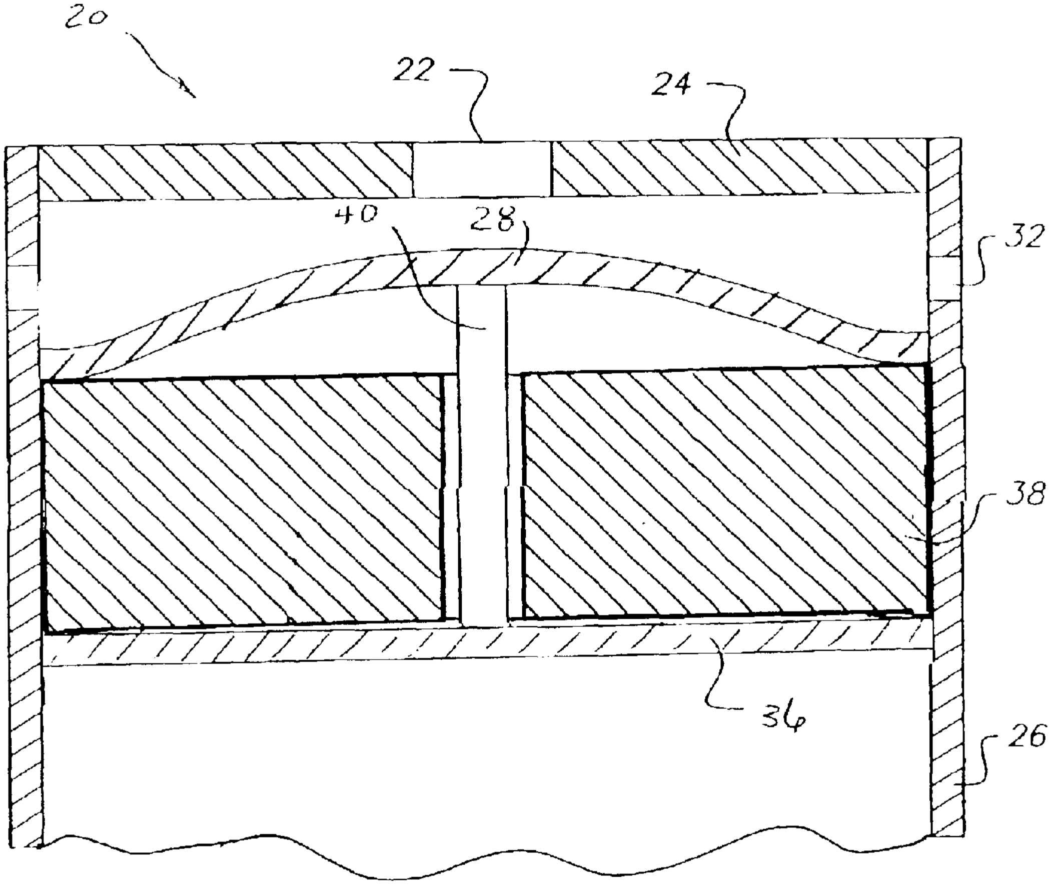
FIG. 6 is a cross-sectional view of the drop-on-demand liquid emission device of FIG. 2 shown in a second actuation stage.

Subsequently (say, several microseconds later) front side membrane 28 is de-energized by making its potential equal to that of mandrel 38. At that time, rear side membrane 36 is energized by applying a potential difference between the conductive portions of rear side membrane 36 and the mandrel. The result is that rear side membrane 36 is caused to be pulled toward central mandrel 38 in conjunction with the release of the stored elastic potential energy. The timing of the de-energization of membrane 28 and the energization of membrane 36 may be simultaneous, or there may be a short dwell period therebetween so that the structure begins to move from the position illustrated in FIG. 2 toward the position illustrated in FIG. 6 under the sole force of stored elastic potential energy in the system. When coupled membranes 28 and 36 move in a first direction toward nozzle orifice 22, the contact area between rear side membrane 36 and mandrel 38 progressively increases and the surface area of the rear side membrane progressively decreases because its curvature decreases. Simultaneously, the contact area between front side membrane 28 and the mandrel progressively decreases and the surface area of the front side membrane progressively increases. Still referring to FIG. 2, this action pressurizes the liquid in chamber 30 behind the nozzle orifice, causing a drop to be ejected from the nozzle orifice. To optimize both refill and drop ejection, ports 32 should be properly sized to present sufficiently low flow resistance so that filling of chamber 30 is not significantly impeded when membrane 28 is energized, and yet present sufficiently high resistance to the back flow of liquid through the port during drop ejection, as is well known in the design of inkjet print heads.

Figure 7:
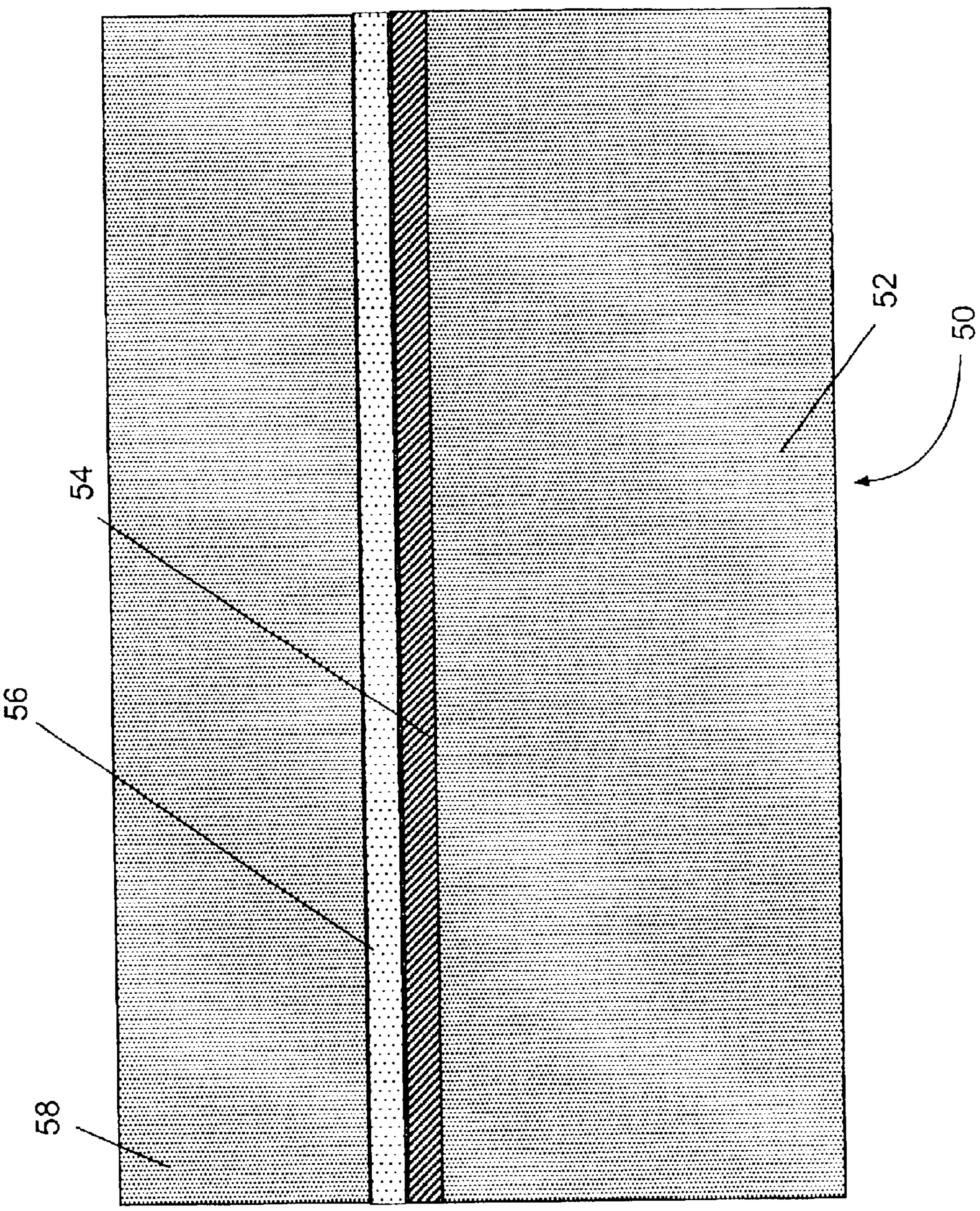
FIG. 7 is a cross-section of a Silicon on Insulator (SOI) electrostatic print head substrate of a first conductivity type having a lower silicon layer, a nitride insulator, a sacrificial oxide, and an upper silicon layer.

Referring to FIG. 7, an SOI substrate 50 is shown comprising a substrate layer 52, typically made of, but not limited to, single crystal silicon; a first membrane layer 54, preferably silicon nitride or combinations of silicon nitride, silicon oxide, and polysilicon; a first sacrificial layer 56, preferably but not limited to silicon dioxide; and a mandrel layer 58, preferably doped single crystal silicon. As is well known in the art of preparation of Silicon on Insulator substrates, these layers may be deposited such as for example by chemical vapor deposition techniques, or bonded by transfer from secondary wafers made from silicon and related materials. In the illustrative embodiment of the present invention typical layer thicknesses of substrate layer 52 are in the range of from 10 to 1000 microns. First membrane layer 54 thickness may be between 0.1 and 10 microns. First sacrificial layer 56 may be between 0.1 and 10 microns. Mandrel layer 58 is between, say, 1 and 100 microns. These thicknesses are typically achieved in the art of SOI substrate fabrication.

Figure 8A:
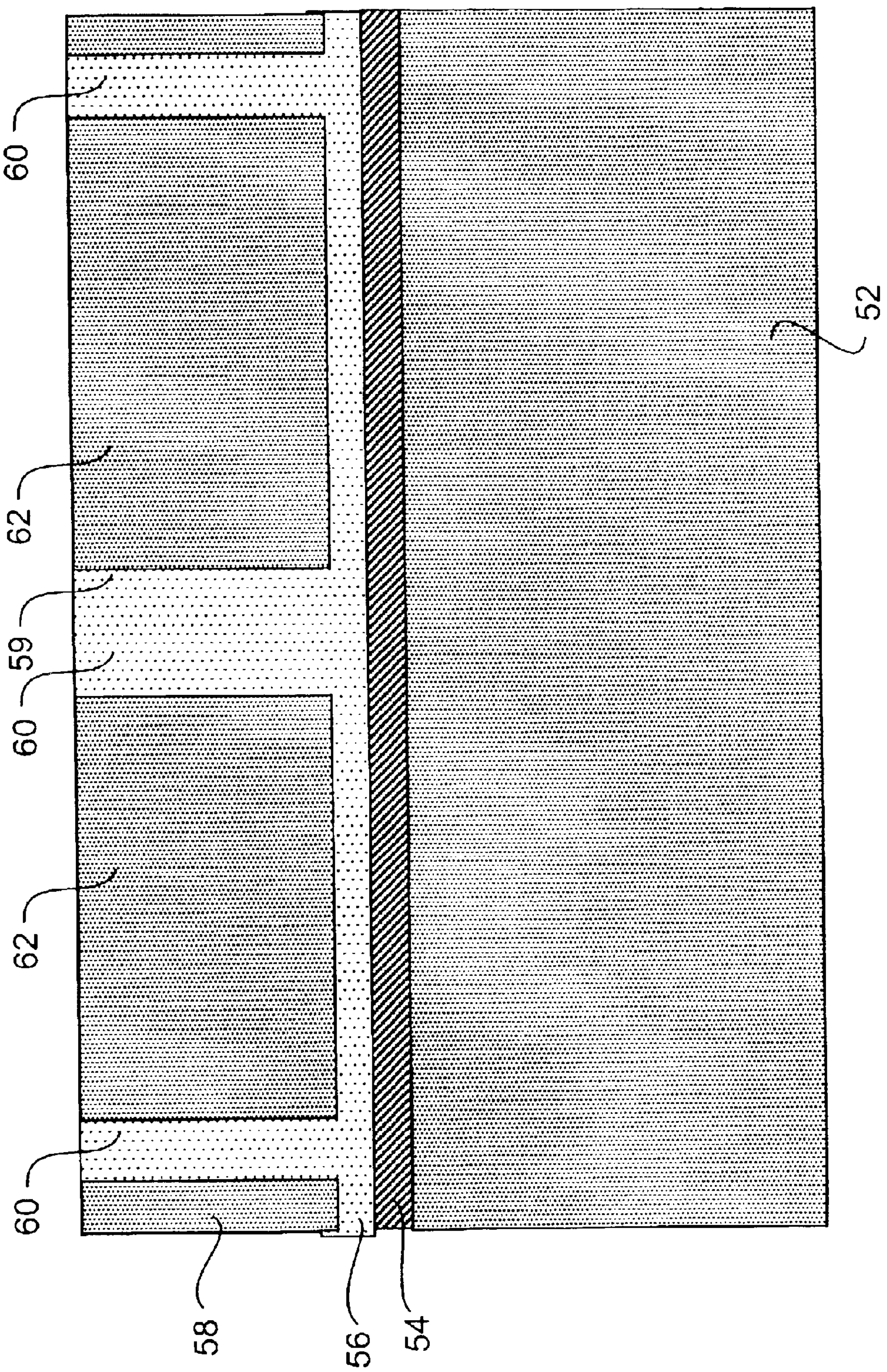
FIGS. 8*a* and 8*b* are side and top cross-sectional views, respectively, of the electrostatic print head of FIG. 7 after another step of the process.
Figure 8B:
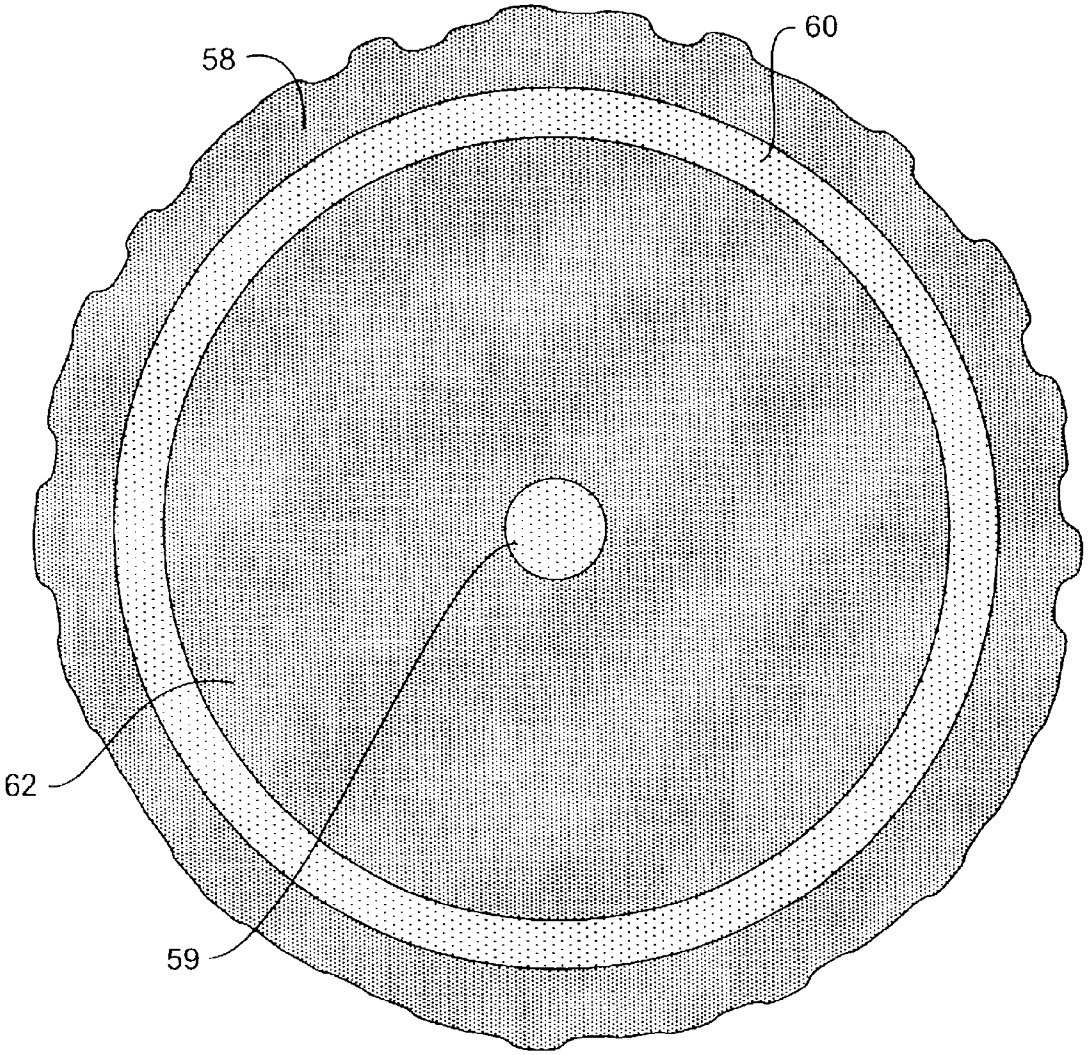

Referring to FIGS. 8*a* and 8*b*, a central trench 59 and a peripheral trench 62 are etched into mandrel layer 58 and filled with sacrificial material, preferably silicon dioxide. The sacrificial material is then planarized to provide a ring-shaped mandrel 62. Central trench 59 provides for connection between subsequently deposited layers and first membrane layer 54, and peripheral trench 60 provides electrical isolation of mandrel 62.

As can be appreciated by one skilled in the art of semiconductor device fabrication, inlaid sacrificial material as shown in FIGS. 8*a* and 8*b* can also be achieved by providing an SOI substrate having a substrate layer, typically single crystal silicon, a first membrane layer, preferable silicon nitride or combinations of silicon nitride, silicon oxide, and polysilicon, and a thick first sacrificial layer, preferably silicon dioxide. The sacrificial layer is etched in the regions where the mandrel is to be formed and then the material of the mandrel is deposited and planarized to remove the mandrel material entirely from the top (FIG. 8) surface of the first sacrificial layer where it was not etched.

Figure 9:
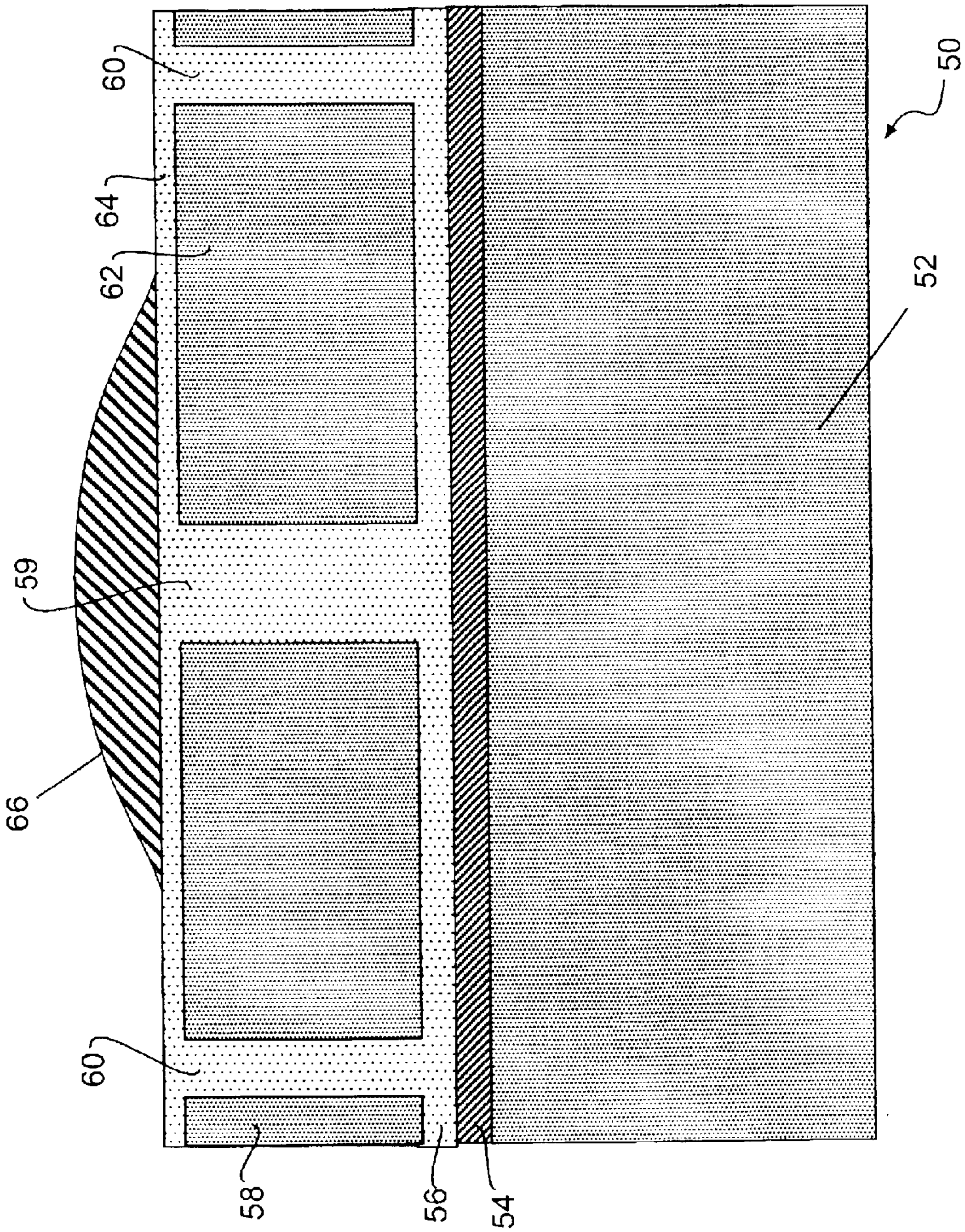
FIG. 9 is a cross-section of the print head of FIG. 8 provided with a flowed lens.

Referring to FIG. 9, an optional sacrificial layer 64, composed for example of the same material as first sacrificial layer 56, is deposited on the planarized surface. Thus, mandrel 62 is entirely surrounded by sacrificial material. Optional sacrificial layer 64 will provide an upper electrode having a greater released area, as will be subsequently described. Silicon oxide may also be grown on mandrel 62 to provide the optional sacrificial layer in the case the mandrel is made of silicon.

Next, as shown in FIG. 9 a curved lens 66, formed with a contact angle preferable greater than 170 degrees, is formed over mandrel 62. Such a lens may be formed by exposing a polymer, patterned in cross-section in the form of a rectangle, to solvent vapors or by exposing a patterned polymer to heat, as is well known in the art of manufacture of optical lenses. Alternative methods of forming a curved lens, well known in the art of microstructure fabrication, include grayscale mask exposure of a photoresist and lamination of a material such as a polymer that has been pressed into a lens form.

Figure 10:
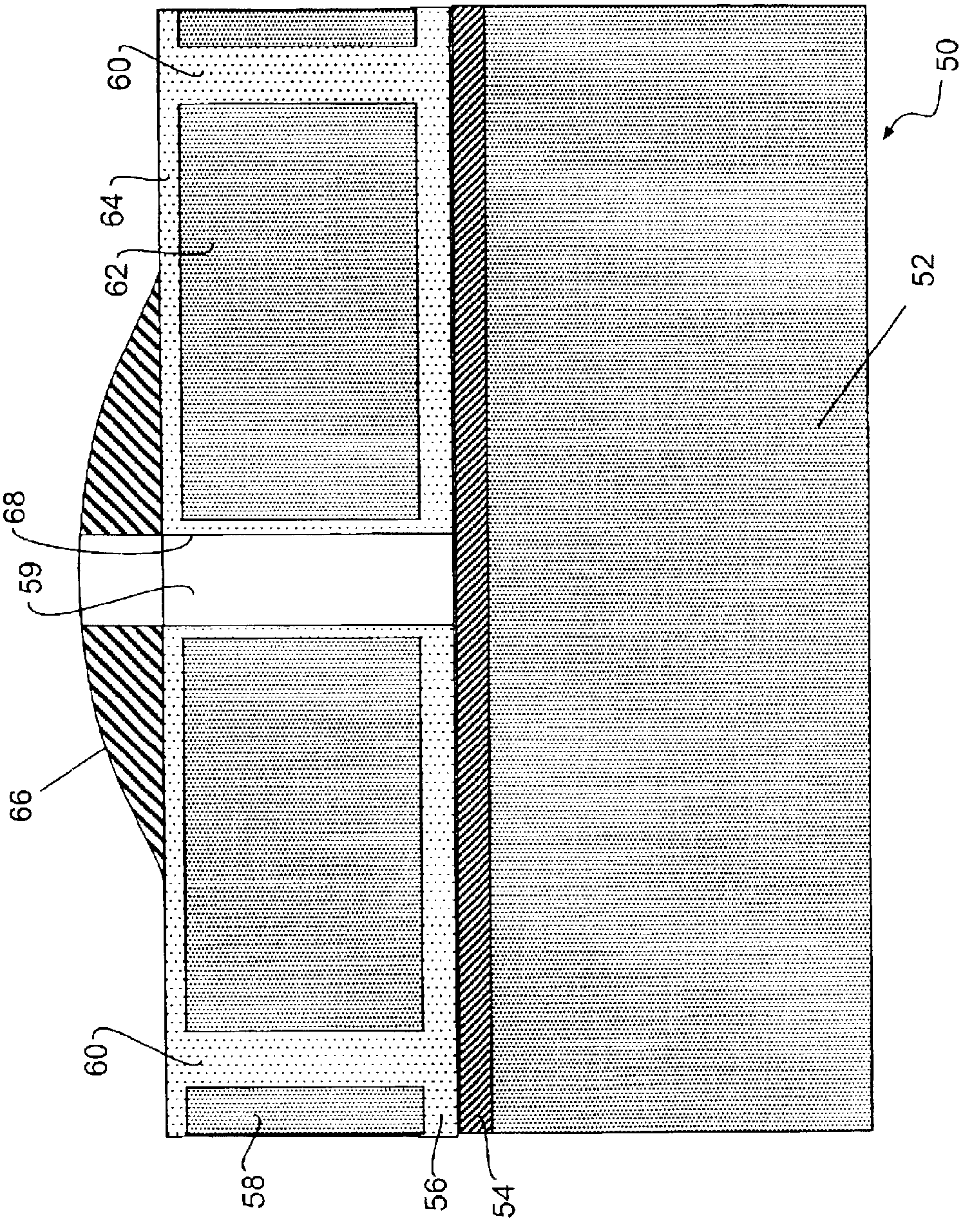
FIG. 10 is a cross-section of the print head after definition and etching of a coupling channel entirely through the lense and mandrel.

Referring to FIG. 10, after formation of lens 66, a connecting opening 68 is etched in the lens, in optional sacrificial layer 64, in the sacrificial material in central trench 59, and in second sacrificial layer 64. The connecting opening is formed, for example by masking the lens with a hard mask and anisotropically etching the lens and central trench, the etch proceeding down to first membrane layer 54.

Figure 11:
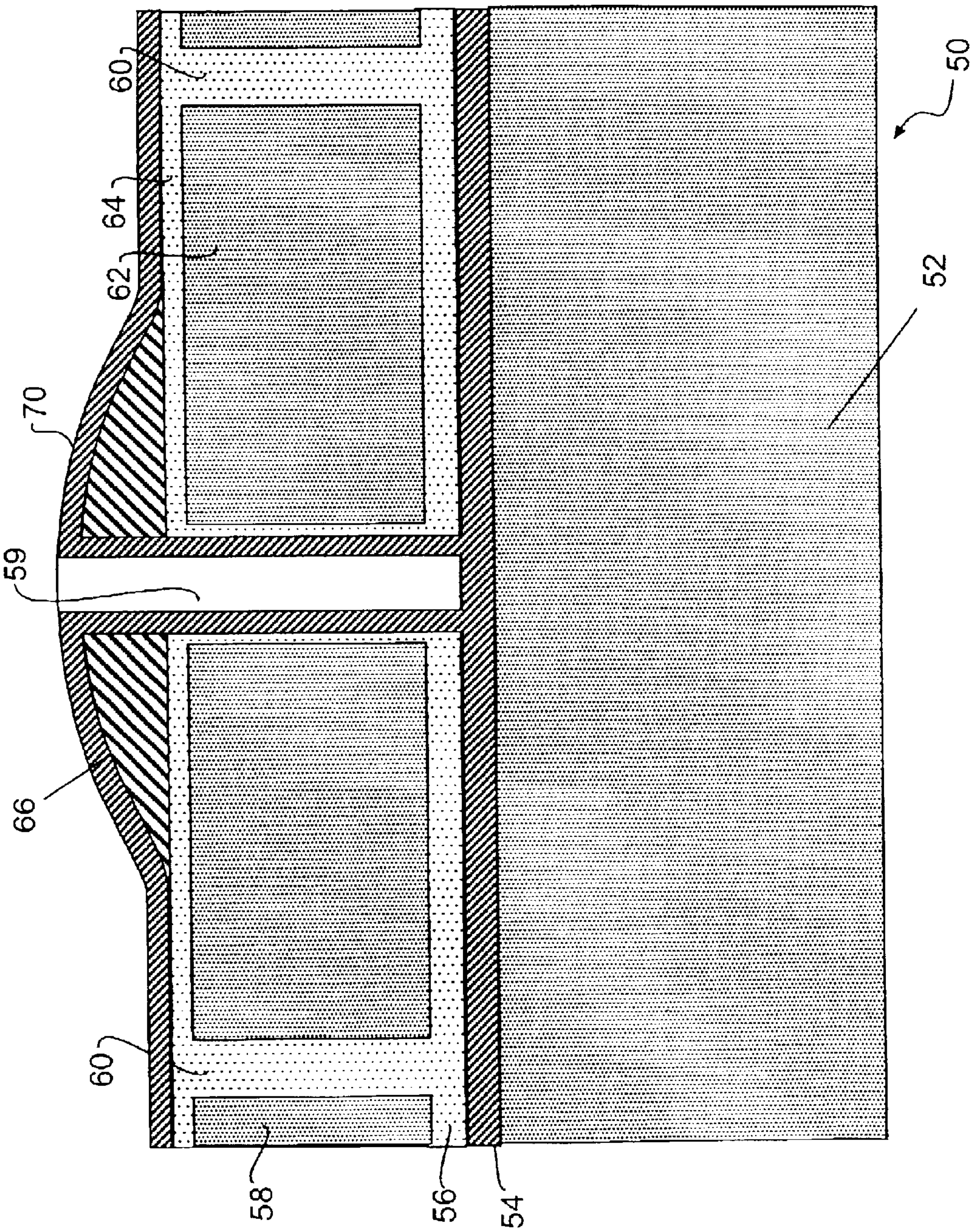
FIG. 11 is a cross-section of the print head after deposition of a second nitride layer directly contacting the first nitride layer.

As illustrated in FIG. 11, a second membrane layer 70, preferably of silicon nitride, is then deposited conformally such as by plasma enhanced chemical vapor deposition on optional sacrificial layer 64, lens 66, and the walls of central trench 59. Deposited second membrane layer 70 connects to the first membrane layer 54 in the opening etched through the central trench.

Figure 12:
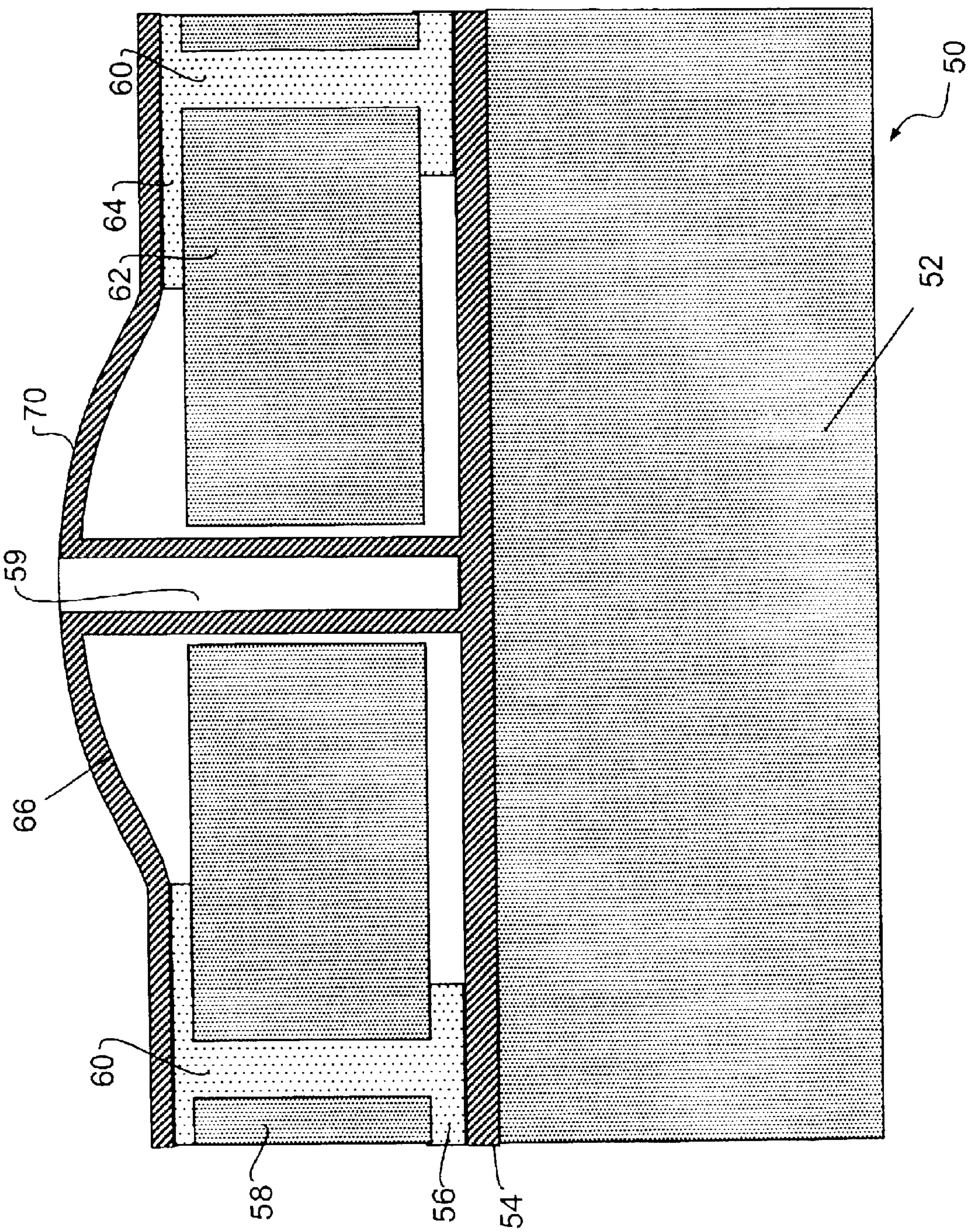
FIG. 12 is a cross-section of the print head after removal of the flowed polymer lens and of portions of the first and third sacrificial oxide layers.

Referring to FIG. 12, sacrificial material in central trench 59 and portions of first sacrificial layer 56 and second sacrificial layer 64 are removed, for example by vapor etching. The etching is best carried out through small orifices (not shown) as is well known in the art of microstructure fabrication, which may be subsequently filled by chemical vapor deposition.

Figure 13A:
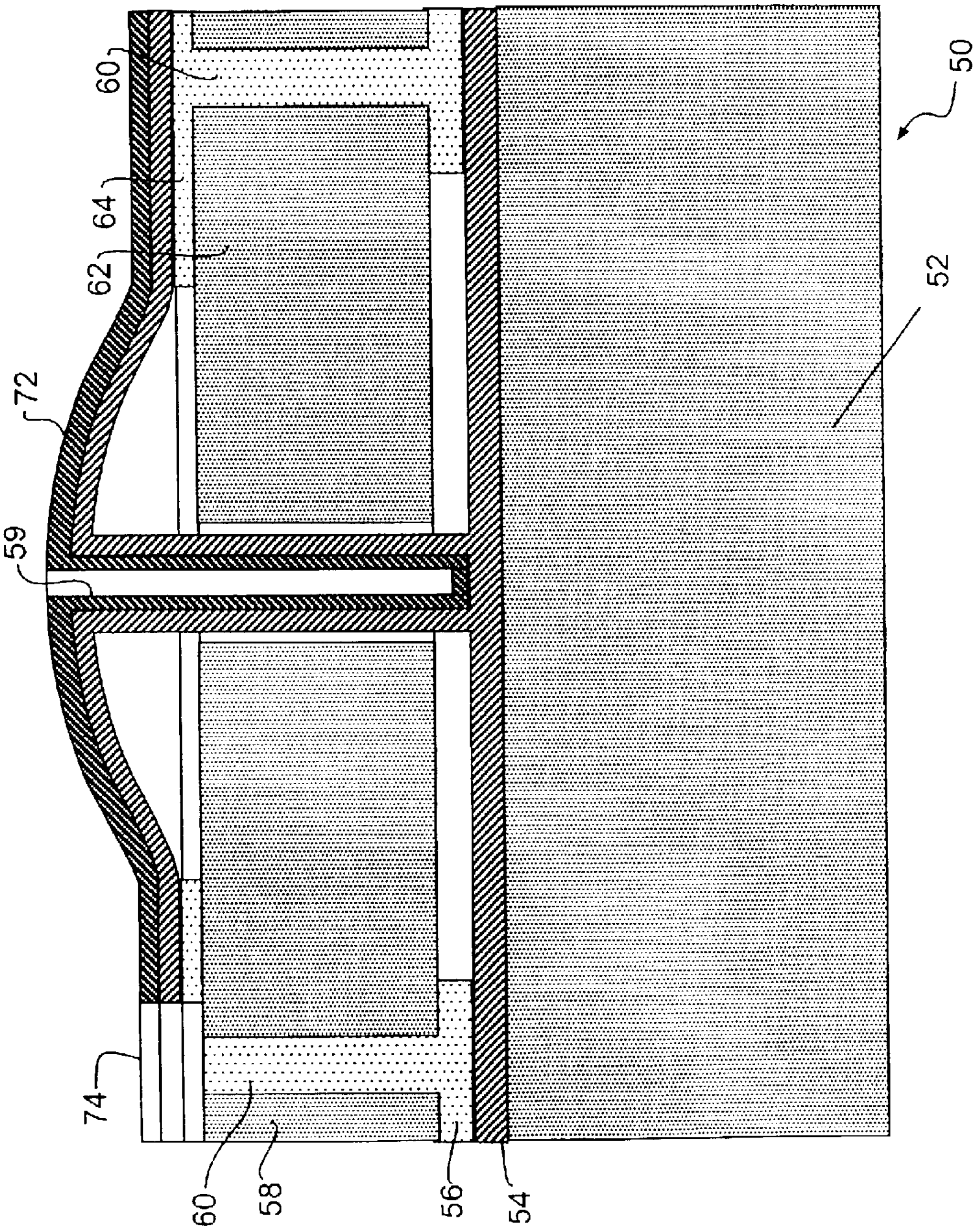
Figure 13B:
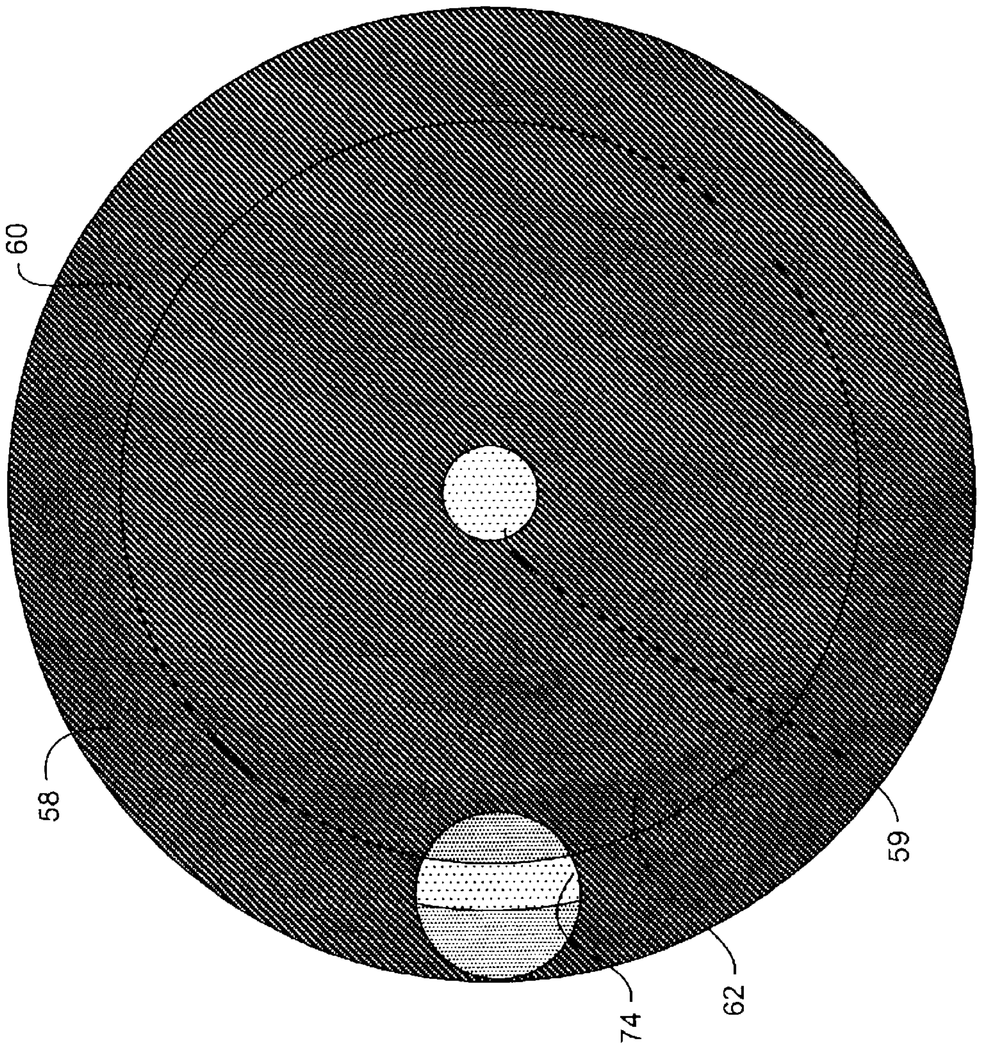
Figure 13C:
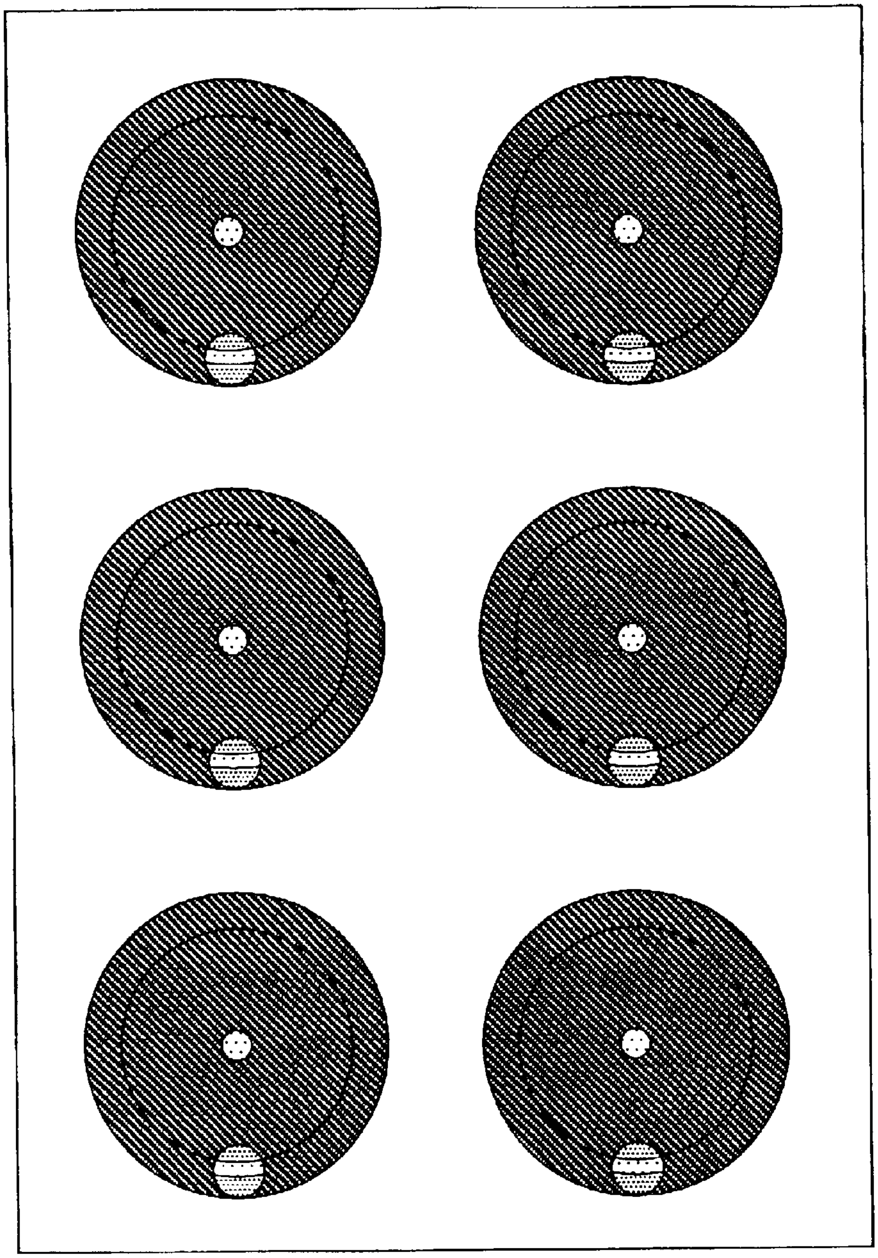
FIG. 13*c* is a view similar to FIG. 13*c* but showing a nozzle plate with several drop-on-demand liquid emission devices.

In FIG. 13*a*–13*c*, a first electrode layer 72, for example a conductive layer such as doped polysilicon, is deposited conformally on second membrane layer 70. The combination first electrode and second membrane layers are removed by etching from a portion of the mandrel to form a contact region 74.

Figure 14:
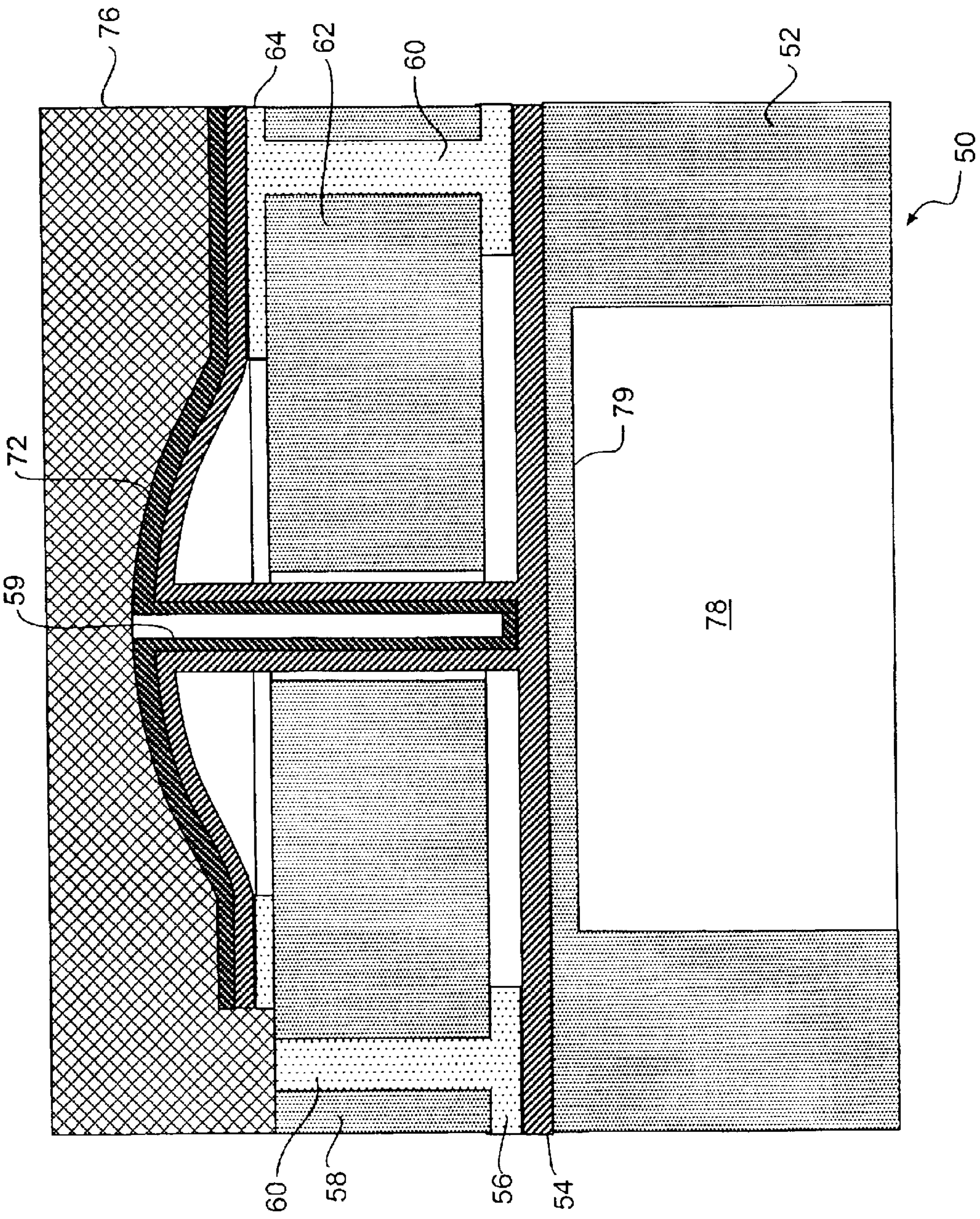
FIG. 14 is a cross-section of the print head after deposition of an upper protective film and removal of a portion of the lower silicon layer of the SOI substrate.

Referring to FIG. 14, a protective coating 76 is next deposited opposite the substrate to provide means for handling the substrate during further processing. FIG. 14 also shows a result of such further processing, specifically formation of an ink cavity 78 by deep reactive etching of a portion of substrate layer 52. Deep anisotropic plasma etches are well known for many materials in the field of micromachining. As shown in FIG. 14, the deep reactive etching does not extend entirely to the first membrane layer. Rather, a portion of substrate 52 is left unetched, forming second electrode 79 in contact with first membrane layer 54 in the central region of the actuator. In this case, the substrate is silicon and second electrode layer 54 is conductive because it is doped. Many other methods of forming the ink cavity are also well known, for example micro-discharge machining is possible if the substrate is a metallic material. Alternatively, the ink cavity could have been embossed in substrate 59 and a second electrode layer 79 formed by deposition of a conductive layer. Because the second electrode layer and the first membrane layer are so thin as to be flexible and because the second membrane layer contacts the first membrane layer, the first and second membranes and the associated first and second electrode layers are so configured to move jointly with respect to the mandrel.

Figure 15:
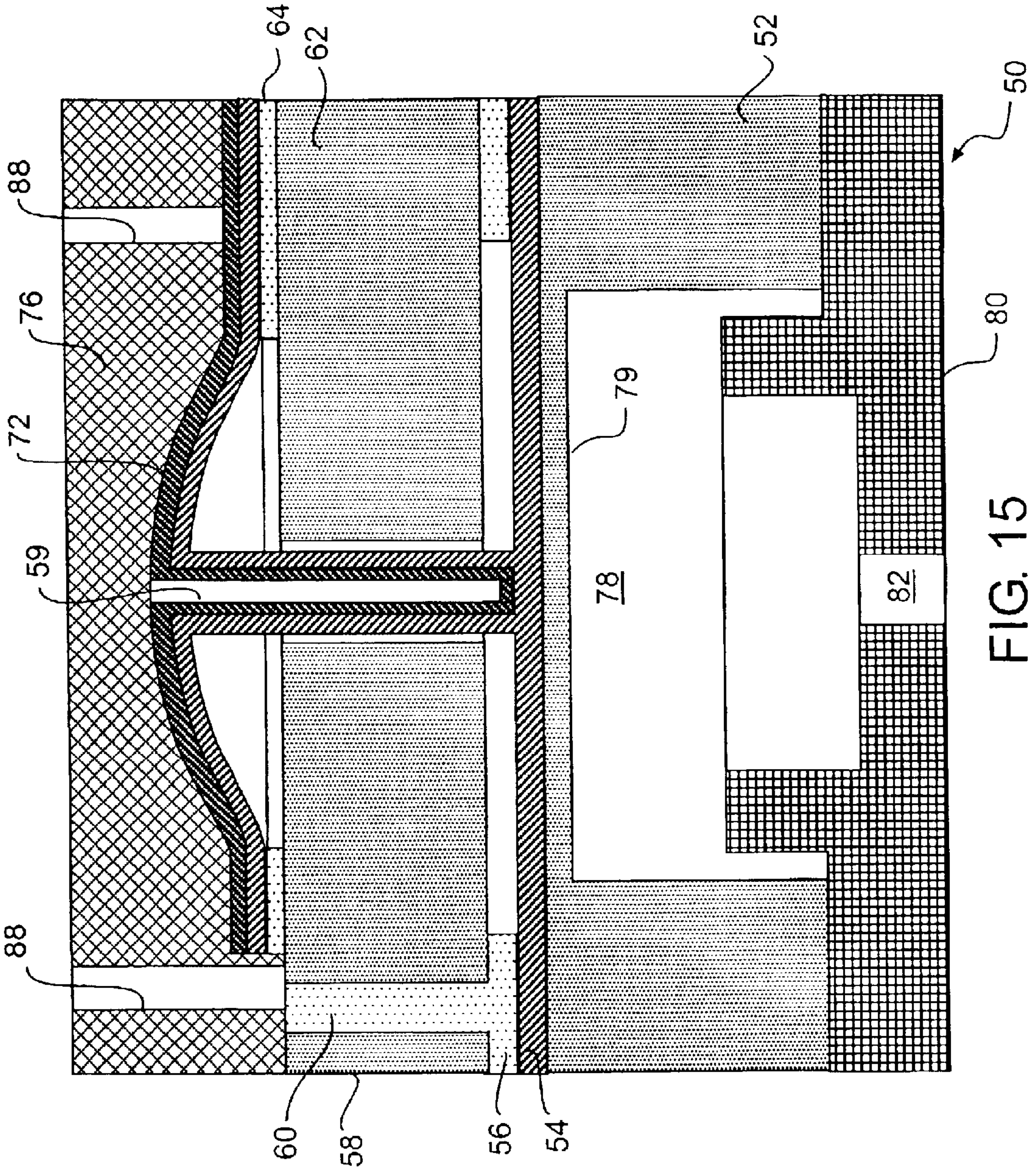
FIG. 15 is a cross-section of the print head after attachment of a nozzle plate and etching of portions of the upper protective film.
Figure 16:
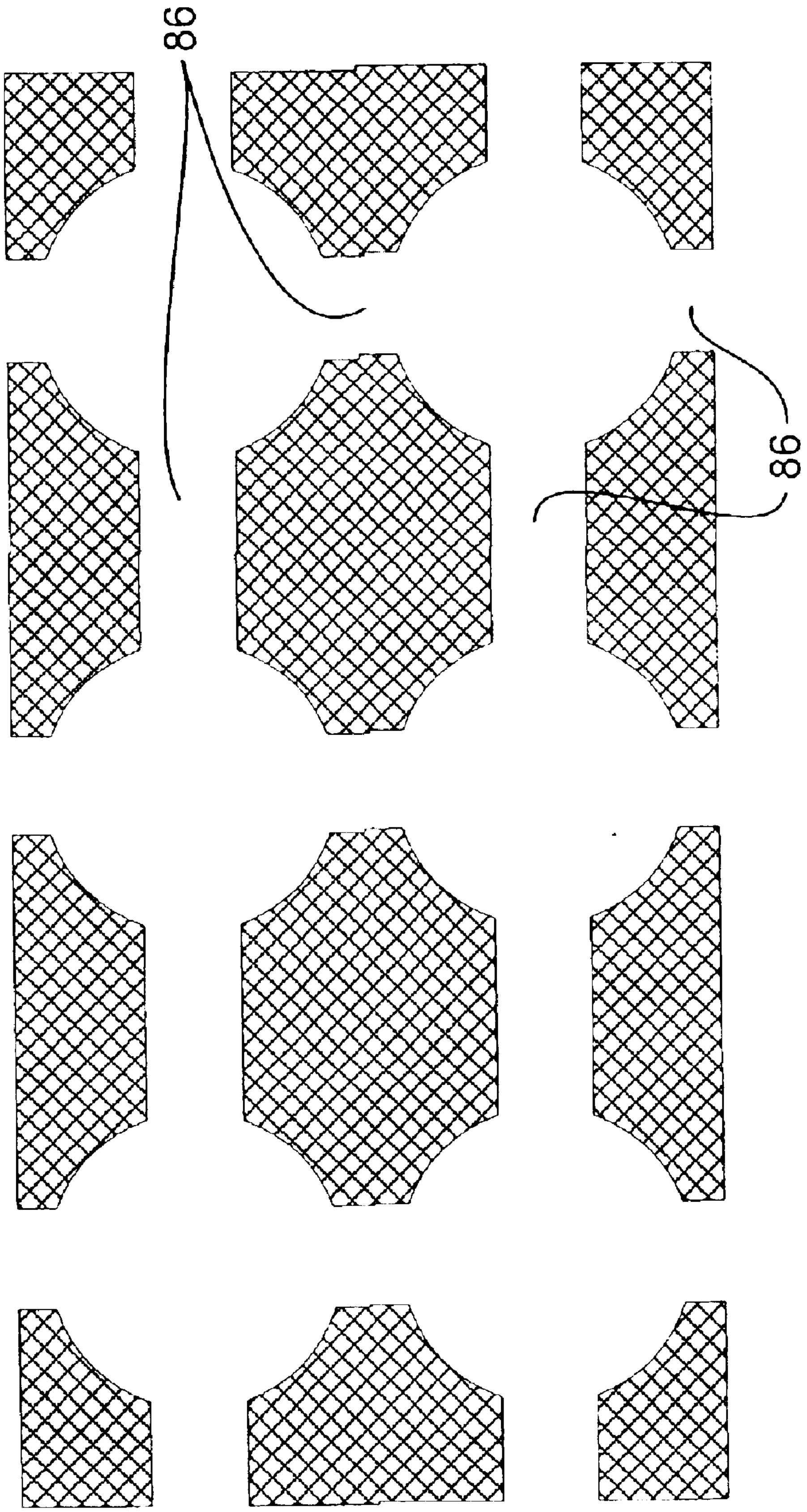
FIG. 16 is a top view of multiple connected ink refill channels.

In FIG. 15, a nozzle plate 80, made preferably of silicon, having a nozzle bore 82 for ink ejection responsive to joint motion of the electrode layers. An alignment feature 84 is shown in nozzle plate 80 to ensure alignment of the nozzle bore to ink cavity 78. As is well known in the art of inkjet ejectors, the nozzle plate may be attached to the substrate by an epoxy bond or by an anodic bonding. The nozzle plate includes channels 86, FIG. 16, for distribution of ink, to the ink cavity.

Figure 17:
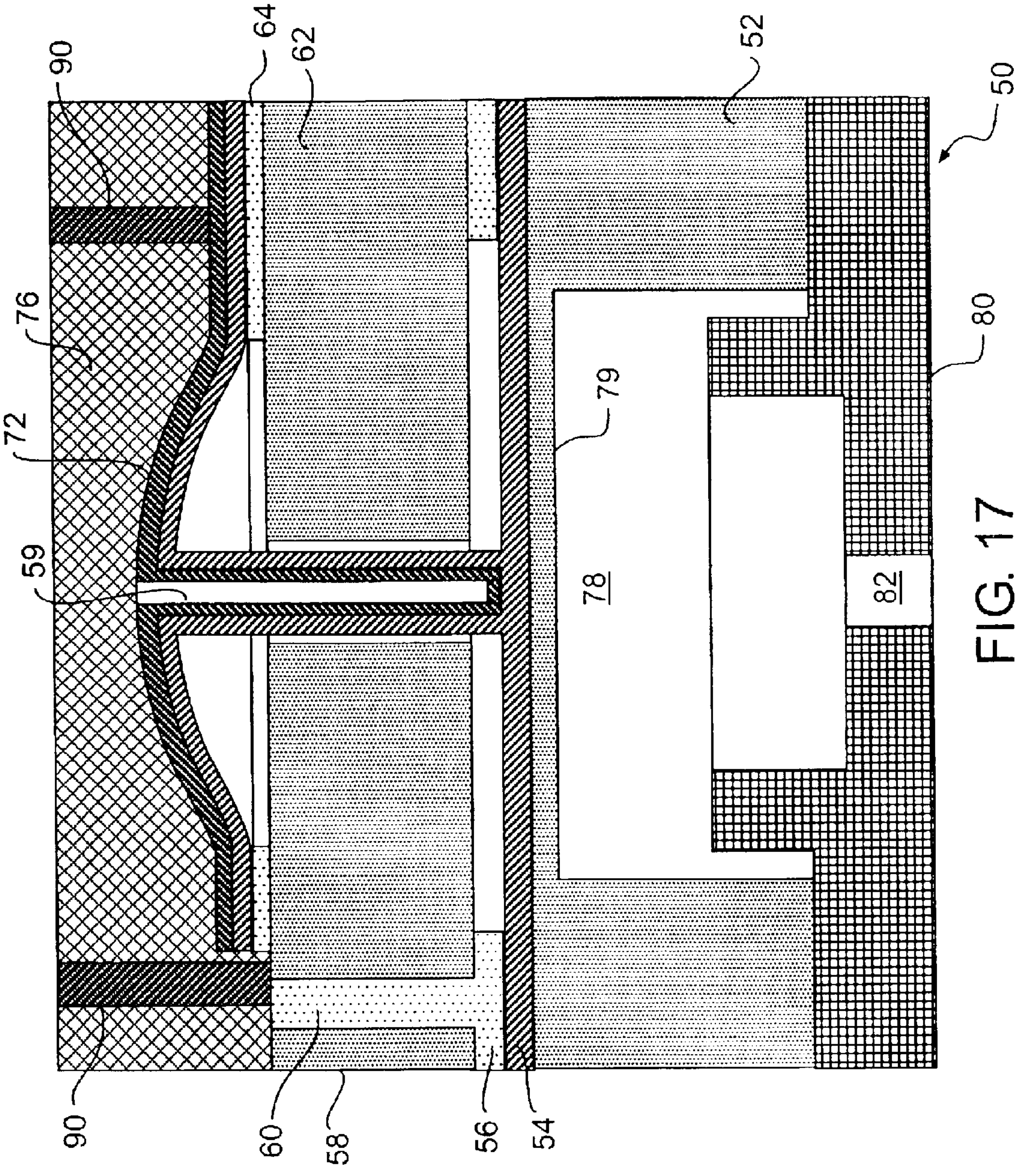
FIG. 17 is a cross-section of the print head with electrical contacts and a relief opening in the upper protective film.
Figure 18:
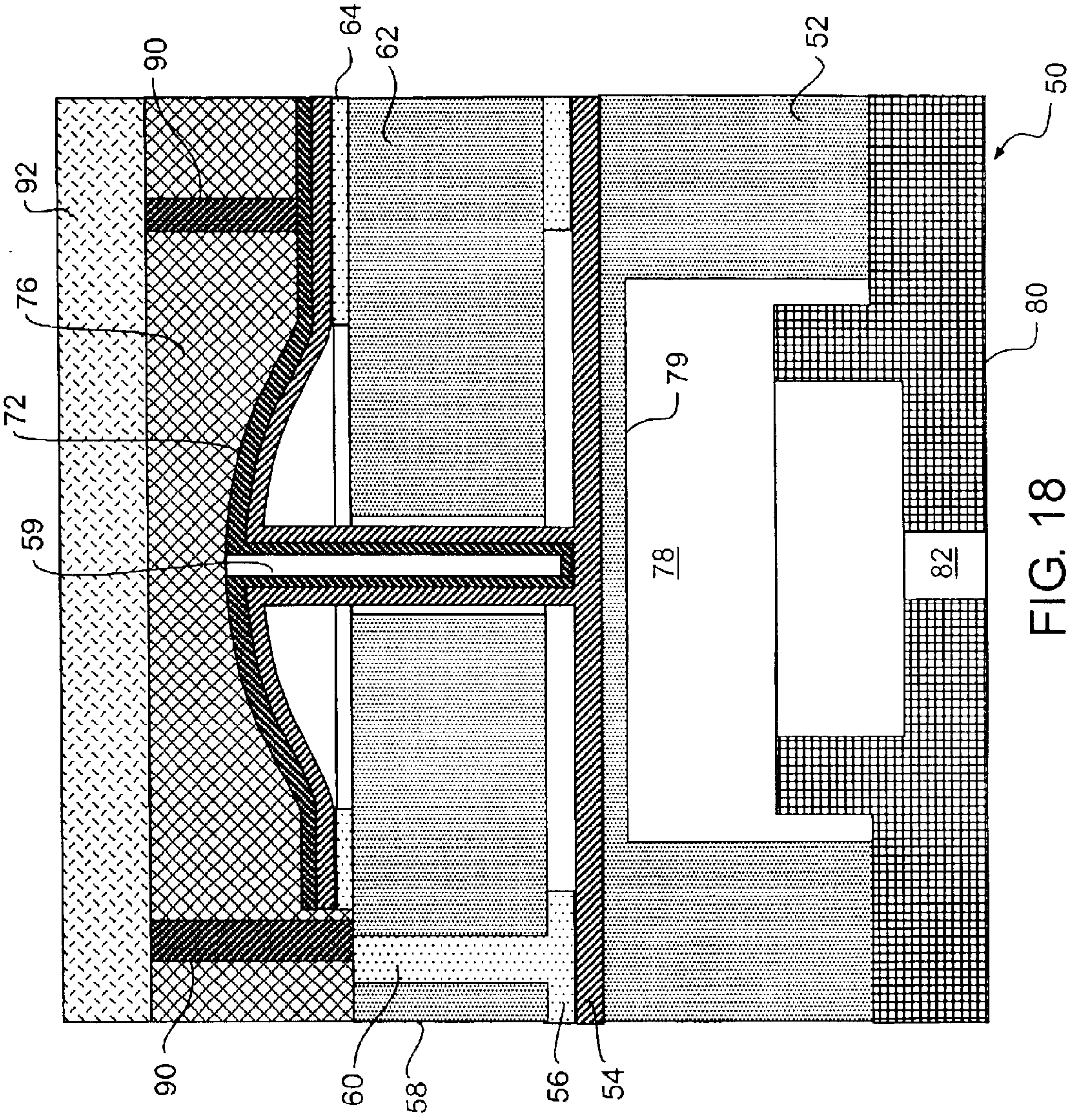
FIG. 18 is a cross-section of the print head with an electronic driver circuit attached to the protective film.
Figure 19:
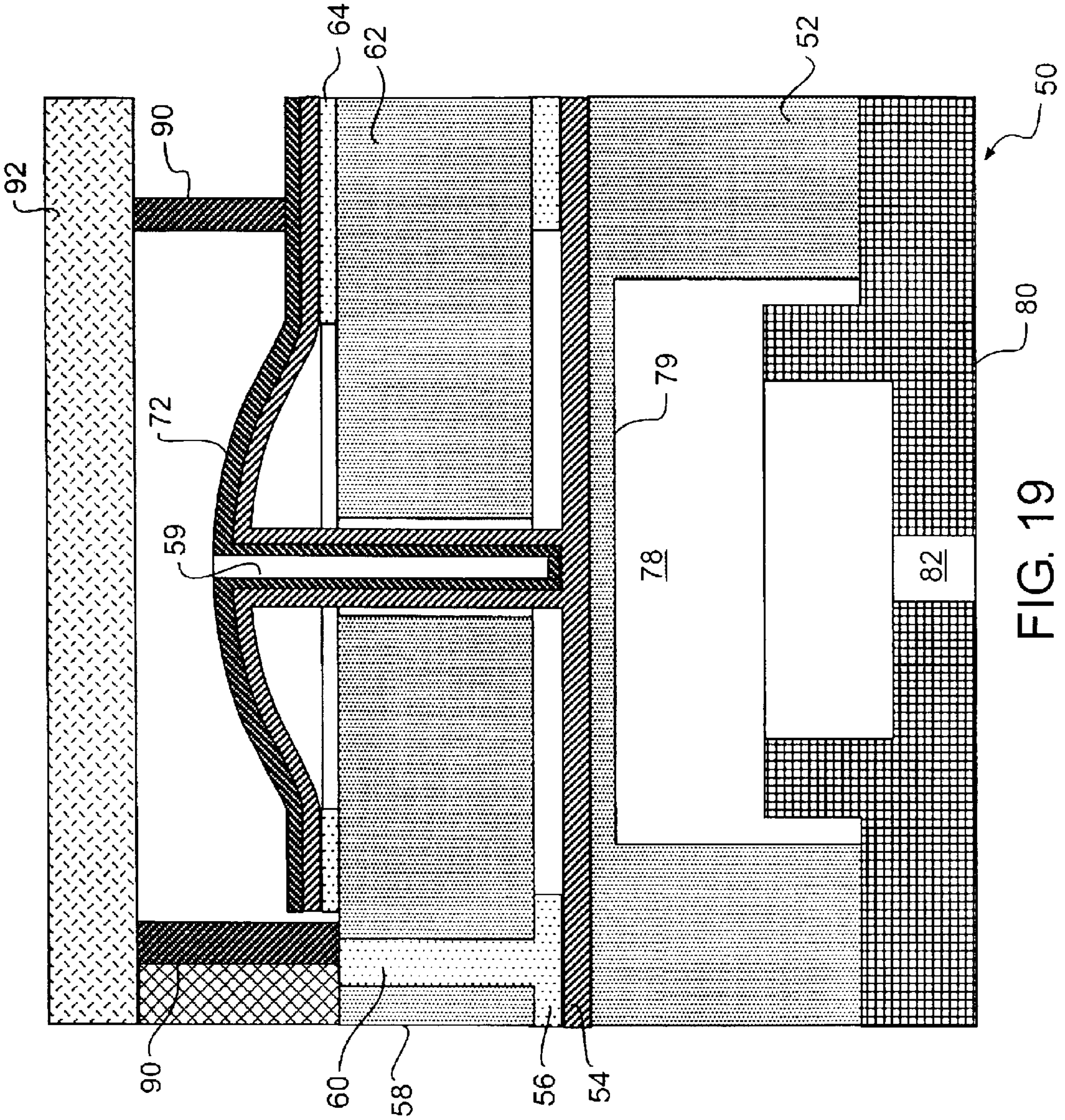
FIG. 19 is a side view of the completed ink ejector with one ink distribution channel, the coupled membrane being shown in its relaxed configuration.

FIG. 15 also shows formation of contact openings 88 for electrical connection of mandrel 62 and the first electrode layer 72 by means of deposited via connections 90 shown in FIG. 17. Such electrical connections can be used to connect mandrel 62 and second electrode layer 79 to electronic circuits, for example circuits provided on a CMOS substrate 92 bonded to the via connections as shown in FIG. 18. Protective layer 76 is shown removed in FIG. 19, for example by plasma etching, to allow unimpeded motion of the first and second membrane layers and first and second electrode layers with respect to the mandrel when voltages are applied through the via connections to the mandrel and the first electrode layer. As is conventionally the case, the substrate and the CMOS substrate are assumed to be at a common potential.

What is claimed is:

1. A method of making a multi-layer micro-electromechanical electrostatic actuator for producing drop-on-demand liquid emission devices, said method comprising:

on a substrate having a top surface of a first dielectric material, forming an electrically isolated, planar mandrel surrounded by sacrificial material on at least the surfaces of the mandrel not opposing the substrate;

providing a lens at a position opposed to the substrate and located over the mandrel;

removing, by etching to the substrate, portions of the lens and sacrificial material in at least one region removed from the mandrel by portions of the sacrificial material;

forming a subsequent layer of dielectric material on the surfaces above the mandrel and lens opposed to the substrate and within the etched portions of the lens and sacrificial material;

removing portions of sacrificial material and portions of the lens so as to form cavities above and below the mandrel which are connected together within the etched portions of the lens and sacrificial material;

forming an electrode layer upon the top of the layer of dielectric material; and removing a portion of the substrate material to form a second electrode layer, whereby the first electrode layer and the second electrode layer are free to move together relative to the mandrel and the first electrode layer and the mandrel are electrically isolated from the substrate.

2. A method as set forth in claim 1, wherein the first sacrificial material is silicon oxide.

3. A method as set forth in claim 1, wherein the first sacrificial material is silicon nitride.

4. A method as set forth in claim 1, wherein the electrically isolated, planar mandrel is surrounded by sacrificial material on at all surfaces, and the sacrificial material on the mandrel opposing the substrate is silicon oxide.

5. A method as set forth in claim 1, wherein the lens is formed by depositing a polymer and reflowing the polymer by heat.

6. A method as set forth in claim 1, wherein the lens is formed by depositing a polymer and reflowing the polymer by exposure to a solvent vapor.

7. A method as set forth in claim 1, wherein the substrate having a top surface of a first dielectric material is an SOI substrate formed by sequential deposition of silicon nitride and silicon oxide on a silicon wafer subsequent bonding of a silicon wafer to the oxide surface.

8. A method as set forth in claim 1, wherein the mandrel is formed on an SOI substrate comprising layers of silicon, silicon nitride, silicon oxide and silicon respectively.

9. A method as set forth in claim 1, wherein the dielectric material on the surfaces above the mandrel and the lens within the etched portions of the lens entirely fills the etched portions of the lens and the sacrificial material.

10. A method as set forth in claim 1, wherein the substrate having a top surface of a first dielectric material, includes a layer of conductive material and a layer of a third dielectric material between the substrate and the first dielectric material.

11. A method as set forth in claim 1, further including a semiconductor device made on a silicon wafer bonded to the side of the electrostatic actuator opposing the substrate and connected electrically thereto.

* * * * *